US008560540B2

(12) United States Patent
Oe et al.

(10) Patent No.: US 8,560,540 B2
(45) Date of Patent: Oct. 15, 2013

(54) INFORMATION SEARCH SYSTEM, INFORMATION SEARCH METHOD, AND PROGRAM

(75) Inventors: Naoyuki Oe, Tokyo (JP); Takahiro Shima, Tokyo (JP); Kazuki Mae, Tokyo (JP); Hiroshi Saito, Tokyo (JP); Yusuke Minamii, Tokyo (JP); Ryo Soneta, Tokyo (JP)

(73) Assignee: Humming Heads Inc., Tokyo (JP)

( * ) Notice: Subject to any disclaimer, the term of this patent is extended or adjusted under 35 U.S.C. 154(b) by 197 days.

(21) Appl. No.: 12/718,810

(22) Filed: Mar. 5, 2010

(65) Prior Publication Data

US 2010/0161606 A1 Jun. 24, 2010

Related U.S. Application Data (63) Continuation of application No. PCT/JP2008/065577, filed on Aug. 29, 2008.

(30) Foreign Application Priority Data

Sep. 7, 2007 (JP) ................................. 2007-262705

(51) Int. Cl.
*G06F 7/00* (2006.01)
*G06F 17/30* (2006.01)

(52) U.S. Cl.
USPC ........................................................ 707/736

(58) Field of Classification Search
USPC ................................................. 707/736, 802
See application file for complete search history.

(56) References Cited

U.S. PATENT DOCUMENTS

| 5,906,201 A | 5/1999 | Nilson | |
|---|---|---|---|
| 7,933,929 B1* | 4/2011 | McClendon et al. | 707/802 |
| 2003/0112742 A1 | 6/2003 | Piper | |
| 2004/0148326 A1* | 7/2004 | Nadgir et al. | 709/200 |

(Continued)

FOREIGN PATENT DOCUMENTS

| CN | 1414555 A | 4/2003 |
|---|---|---|
| EP | 1 306 848 A1 | 5/2003 |

(Continued)

OTHER PUBLICATIONS

International Search Report mailed Dec. 9, 2008, issued in corresponding Application No. PCT/JP2008/065577, filed Aug. 29, 2008.

(Continued)

*Primary Examiner* — Robert Beausoliel, Jr.
*Assistant Examiner* — Nicholas Allen
(74) *Attorney, Agent, or Firm* — Christensen O'Connor Johnson Kindness PLLC (57) ABSTRACT

This invention provides an information search system including a management table which stores a name of a memory area and memory area information indicating the memory area in association with each other. When received source information search destination information indicates that source information to be searched is stored in a memory, the information search system searches the management table for a name of a memory area which matches a received source information name of the source information to be searched. When the name of the memory area which matches the received source information name of the source information to be searched is retrieved, the system acquires information which matches the received search target condition information from memory area information associated with the retrieved name of the memory area.

9 Claims, 7 Drawing Sheets

(56) References Cited

U.S. PATENT DOCUMENTS

| | | |
|---|---|---|
| 2004/0205061 A1* | 10/2004 | Nakazato et al. ............. 707/3 |
| 2005/0027702 A1* | 2/2005 | Jensen et al. ................. 707/3 |
| 2005/0125383 A1 | 6/2005 | Gilfix |
| 2005/0132123 A1* | 6/2005 | Glaum et al. ............. 711/100 |
| 2006/0080295 A1* | 4/2006 | Elsaesser et al. ............. 707/3 |
| 2006/0195465 A1* | 8/2006 | Atchison et al. .......... 707/102 |
| 2007/0061487 A1* | 3/2007 | Moore et al. .............. 709/246 |
| 2007/0194957 A1* | 8/2007 | Watanabe ................. 341/106 |
| 2008/0122853 A1* | 5/2008 | Brown et al. ............. 345/522 |
| 2009/0030898 A1* | 1/2009 | Otsuki ......................... 707/5 |
| 2009/0307218 A1* | 12/2009 | Selly ........................... 707/6 |
| 2010/0069035 A1* | 3/2010 | Johnson ................. 455/404.1 |

FOREIGN PATENT DOCUMENTS

| | | |
|---|---|---|
| JP | 10-21123 A | 1/1998 |
| JP | 10-501086 A | 1/1998 |
| JP | 2003-150442 A | 5/2003 |
| JP | 2005-352779 A | 12/2005 |
| JP | 2006-277031 A | 10/2006 |
| JP | 2007-179492 A | 7/2007 |
| JP | 2007-219577 A | 8/2007 |
| WO | 97/16794 A1 | 5/1997 |
| WO | 2005/122563 A1 | 12/2005 |

OTHER PUBLICATIONS

Notification of the First Office Action mailed Aug. 26, 2011, issued in corresponding Chinese Application No. 200880105462.2, filed Aug. 29, 2008, 7 pages.

Supplementary European Search Report mailed Sep. 1, 2011, issued in corresponding European Patent Application No. EP 20080829070, filed Aug. 29, 2008, 3 pages.

International Preliminary Report on Patentability and Written Opinion mailed Apr. 8, 2010, issued in corresponding International Application No. PCT/JP2008/065577, filed Aug. 29, 2008, 8 pages.

Japanese Patent Office First Office Action, mailed Apr. 3, 2012, issued in corresponding Japanese Application No. 2009-531212, 6 pages.

Notification of the Second Office Action mailed Aug. 22, 2012, issued in corresponding Chinese Application No. 2008801054621, 9 pages (English Translation 13 pages).

Notification of the Second Office Action mailed Aug. 2, 2012, issued in corresponding Chinese Application No. 2008801054621, 9 pages (English Translation 13 pages).

* cited by examiner

F I G. 1

201 Management table

| | 202 | 203 | 204 | 205 | 206 |
|---|---|---|---|---|---|
| Index 1 | Name 1 | Start address 1 | Maximum size 1 | Use size 1 | Date and time 1 |
| Index 2 | Name 2 | Start address 2 | Maximum size 2 | Use size 2 | Date and time 2 |
| Index n | Name n | Start address n | Maximum size n | Use size n | Date and time n |
| ⋮ | ⋮ | ⋮ | ⋮ | ⋮ | ⋮ |

601 Thread management table

| | 602 | 603 |
|---|---|---|
| Process 1 | Number of available threads 1 | Load information 1 |
| Process 2 | Number of available threads 2 | Load information 2 |
| Process n | Number of available threads n | Load information n |
| ⋮ | ⋮ | ⋮ |

INFORMATION SEARCH SYSTEM, INFORMATION SEARCH METHOD, AND PROGRAM

CROSS-REFERENCE TO RELATED APPLICATIONS

This is a Continuation Application of PCT Application No. PCT/JP2008/065577, filed Aug. 29, 2008, which was published under PCT Article 21(2) in Japanese.

This application is based upon and claims the benefit of priority from prior Japanese Patent Application No. 2007-262705, filed Sep. 7, 2007, the entire contents of which are incorporated herein by reference.

BACKGROUND OF THE INVENTION

1. Field of the Invention

The present invention relates to an information search system which promptly searches for user's desired information.

2. Description of the Related Art

Along with penetration of the Internet into the society, the quantities of information that people handle in daily life and social activities become huge. Also, the quantities of information are increasing drastically on a daily basis in the present state. The spread of communication networks enhances the convenience to browse worldwide information. Web services, EDI (electronic data interchange), EC (electronic commerce), and the like become everyday affairs.

Furthermore, by the improved infrastructures and enhanced transmission qualities of high-speed optical communication Internet networks, terrestrial digital broadcasting, satellite communication networks, and GPS (global positioning system), one can use networks regardless of location across the globe. The human society receives the benefits of availability of high-value-added information everywhere using the spread of these information networks and inexpensive devices.

However, it becomes difficult for the people to promptly and adequately search for required desired information from information in huge quantities. Since the quantities of information are too much, and they are located everywhere, an advanced technique is required for a search method.

Enterprises, companies, and individuals require a wide variety of information. It is demanded to instantly provide specialized information as well as corporate information, academic information, and general information.

A search from a gene sequence information database and a full-text search from a literature database are required to handle Terabyte-class information.

In recent years, operation logs of computers are often acquired and stored on a daily basis in enterprises so as to grasp whether or not computers are appropriately used. Such operation logs are stored daily and the quantities of information (data) often reach Terabytes.

In order to use such information, it is required to promptly search information in large quantities for desired information. However, it is difficult for versatile, commercially available relational databases to handle Terabyte-class information.

Information which is difficult for a commercially available database to handle is normally saved in a structured information format such as an XML (extensible markup language) or CSV (comma separated values: a file format that enumerates information by separating it for respective items by commas) format, or a unique format.

As a device for handling structured information, the following proposal such as "XML CSV compression" is known (see patent references 1 and 2). With this proposal, for example, elements other than elements to be processed in XML documents are expressed using a CSV format with respect to XML data so as to reduce the load on a CPU (central processor unit) and to attain memory savings.

Normally, in order to search a large-capacity database for desired information, the user often narrows down conditions step by step and repeats such processes by trial and error.

However, upon searching large-capacity information, a long time is required per information search. Hence, such trial and error works cannot be done within a predetermined period of time (e.g., several hours), and it is normally difficult to practically obtain desired information.

Especially, in case of such large-capacity information, since a time required for file read/write processes with disk I/O (Input/Output) accesses is not negligible, it is important to reduce the number of read/write times of files throughout a user's work, so as to enhance the efficiency and to shorten a time for the user's work.

Patent Reference 1: Jpn. Pat. Appln. KOKAI Publication No. 2006-277031

Patent Reference 2: Jpn. Pat. Appln. KOKAI Publication No. 2007-179492

BRIEF SUMMARY OF THE INVENTION

Summary of the Invention

The present invention can provide an information search system for searching the aforementioned structured information for required information as quickly as possible using computers distributed on a network such as a cluster computer system, an array computer system that allows parallel processes, and grid computing, or high-end personal computers.

The present invention allows an information search based on conditions according to the user's purpose for large-capacity information on the order of several hundred GB (Gigabytes: $10^9$) to TB (Terabytes: $10^{12}$) as quickly as possible.

The present invention provides an information search system, method, and program, which implement a series of works of the aforementioned step-by-step and trial and error information searches by processes on a memory as much as possible.

Upon conducting an information search step by step, a method of storing one search result in a file, and conducting a next search using this file as source information may be used. However, with this method, file read and write accesses are inevitably generated per search.

The present invention allows to write the search result in a memory in place of a file.

Then, no read access from the file is generated in the next search.

Since a memory area in which the search result is written is associated with a name designated by the user, the user can access that memory area as if he or she were accessing a file using a file name.

Therefore, according to the first aspect of the present invention, there is provided an information search system comprising: reception means for receiving search target condition indicating a condition to be searched, source information search destination information indicating in which of a file and a memory source information to be searched is stored, and a source information name of the source information to be searched; a management table which stores a name of a memory area and memory area information indicating the memory area in association with each other; search means for searching the management table for a name of a memory area which matches the received source information name of the source information to be searched when the received source information search destination information indicates that the source information to be searched is stored in the memory; and acquisition means for acquiring information which matches the received search target condition information from a memory area indicated by memory area information associated with the retrieved name of the memory area when the search means retrieves the name of the memory area which matches the received source information name of the source information to be searched.

DETAILED DESCRIPTION OF THE INVENTION

An information search system according to an embodiment of the present invention will be described hereinafter with reference to the drawings.

Figure 1:
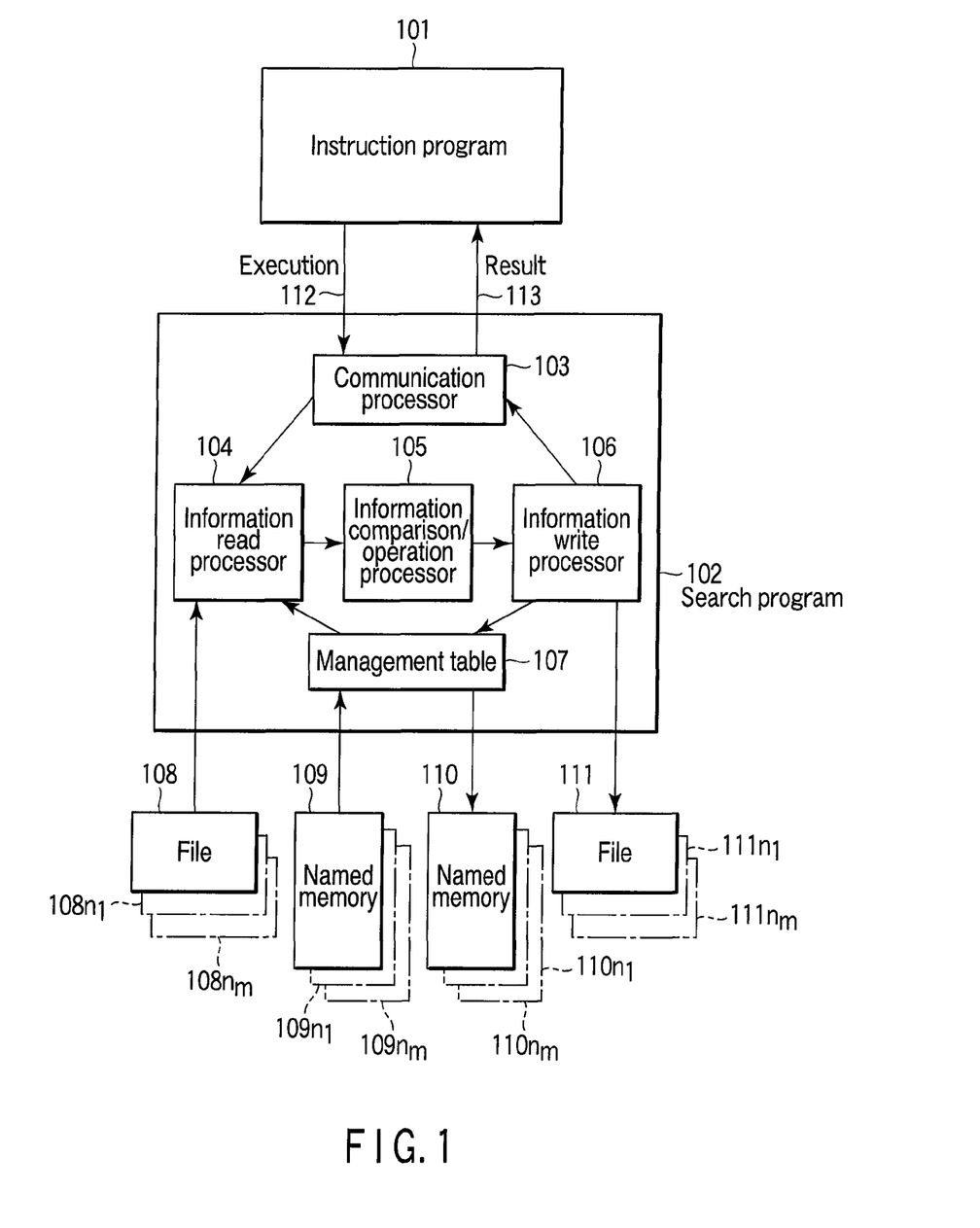
FIG. 1 is a block diagram showing an information search system according to an embodiment of the present invention.

FIG. 1 shows the configuration of a program of an information search system according to the embodiment of the present invention.

This program roughly includes an instruction program 101 and search program 102.

The instruction program 101 and search program 102 may run either on a single machine or different machines.

The instruction program 101 transmits execution parameters to the search program 102 via communication means. The execution parameters include search target condition information indicating conditions to be searched, source information search destination information indicating in which of a file and named memory source information to be search is stored, a source information name of the source information to be searched, storage destination information indicating which of the file and named memory is used to store retrieved information, and a search result information name of the retrieved information to be written.

Note that the "named memory" means a memory area with a name designated by the user.

These execution parameters may be designated as arguments of an execution command of the instruction program (for example, "cmd prm1 prm2 prm3") or may be described in a file and designating this file as an argument of an execution command (for example, "cmd file1"). Or these execution parameters may be designated by a method combining these two methods (for example, "cmd file1 prm1 prm2"). In the above example, cmd indicates a command name, prm1, prm2, and prm3 indicate execution parameters, and file1 indicates a file name.

A GUI (Graphical User Interface) may be given to the instruction program 101 to allow the user to input the execution parameters via the GUI. Such instruction program may be created as a program on a browser.

The search program 102 sequentially scans information sets (structured information (data) groups) in source information (information to be searched) in accordance with the execution parameters transmitted from the instruction program 101 to determine if each information set matches search conditions (search target condition information). If that information set matches the search conditions, the search program 102 writes it as search result information in the named memory or file.

Upon completion of the search of the source information, the search program 102 notifies the instruction program 101 of a message indicating completion of the search processing. At this time, the search program 102 may also notify the instruction program 101 of, e.g., the number of retrieved information sets and a time required for processing.

The search program 102 is launched before the instruction program 101 issues a first execution instruction. The search program 102 is kept loaded on the memory until result outputs of a series of execution instructions by the instruction program 101 are completed.

Since the search program 102 is kept loaded on the memory during a series of execution instructions, which are repetitively executed, the named memory is held on the memory and can be commonly used among the execution instructions during this interval.

The search program 102 includes a communication processor 103, information read processor 104, information comparison/operation processor 105, information write processor 106, and management table 107.

The communication processor 103 receives the execution parameters from the instruction program 101. Also, the communication processor 103 transmits a search result to the instruction program 101. The result to be transmitted includes a success/failure of processing, the number of retrieved information sets, and a time required for the processing. A communication between the instruction program 101 and search program 102 assumes that within a single machine, on the LAN, or on the Internet.

Reference numeral 104 denotes an information read processor. When source information designated by the execution parameter (source information search destination information indicating in which of a file and memory the source information to be searched is stored) is a file, the information read processor 104 temporarily loads a part or full of the file onto a memory. When the source information designated by the execution parameter (source information search destination information) is stored in the named memory, the information read processor 104 specifies a memory area from a name passed as the execution parameter (a source information name of the source information to be searched) with reference to the management table 107.

As the source information, a plurality of files 108 or named memories 109 can be used. Files in folders or drives or files distributed onto a plurality of PCs can also be used as the source information.

The information comparison/operation processor 105 sequentially scans information sets in the source information in accordance with the execution parameters (search target condition information, source information search destination information, and a source information name) transmitted from the instruction program 101, and determines whether or not each information set matches the search conditions.

As the search target condition information, for example, when the source information to be searched includes a date and time information item, a condition indicating whether or not date and time information in information set falls within a specific date and time range may be used.

An optional process for substituting a certain information item value when an information set to be determined matches the condition may be added.

The information write processor 106 writes the information set which is determined by the information comparison/operation processor 105 to match the conditions in a file 111 or named memory 110 in accordance with the execution parameters (storage destination information and a search result information name). When the write destination is a file, the information write processor 106 temporarily holds a part or full of information to be written on a memory, and then writes it in the file.

When the execution parameter (storage destination information) designates a named memory as the write destination, the information write processor 106 assures an area having a given size on the memory, and writes a set of the start address of the assured area and a name designated by the execution parameter (a search result information name) in the management table 107. The information write processor 106 can also record other kinds of information such as a size of the assured memory area and a date and time in the management table together. The size of the memory area to be assured may be designated by an execution parameter. When the write destination is a named memory, the information write processor 106 writes the information set, which is determined by the information comparison/operation processor 105 to match the conditions, in the named memory.

Figure 2:
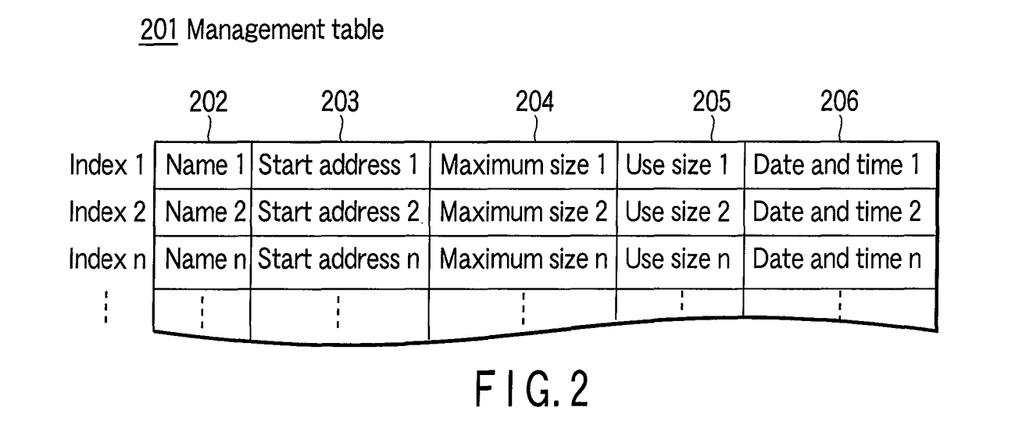
FIG. 2 is a view showing a management table of named memories according to the embodiment of the present invention.

The management table 107 manages named memories. As shown in FIG. 2, the management table 107 records a name 202 of a named memory and a start address 203 on the memory in association with each other, which records can be mutually referred to. Also, the management table 107 records pieces of information such as a maximum size 204 and use size 205. In addition, the management table 107 records other kinds of information such as date and time information 206 indicating a date and time of creation or date and time of updating of the named memory, and a current offset position from the start address. With this management table, a plurality of named memories can be used. Upon completion of scanning of the source information, the search program 102 notifies the instruction program 101 of completion of the search processing.

A result notification 113 can notify the number of retrieved information sets, a time required for the processing, and the like.

The result notification 113 can also notify an error that has occurred during processing of the search program. Such error occurs, for example, when an area of a named memory corresponding to the designated name is not assured, when a memory area of the designated size cannot be assured for the named memory, and when an attempt is made to write information exceeding the designated maximum size in the named memory. Note that as the functions of the search program 102, a function of counting how many identical values a specific information item or a combination of information items includes may be added, thus allowing efficient counting.

Figure 3:
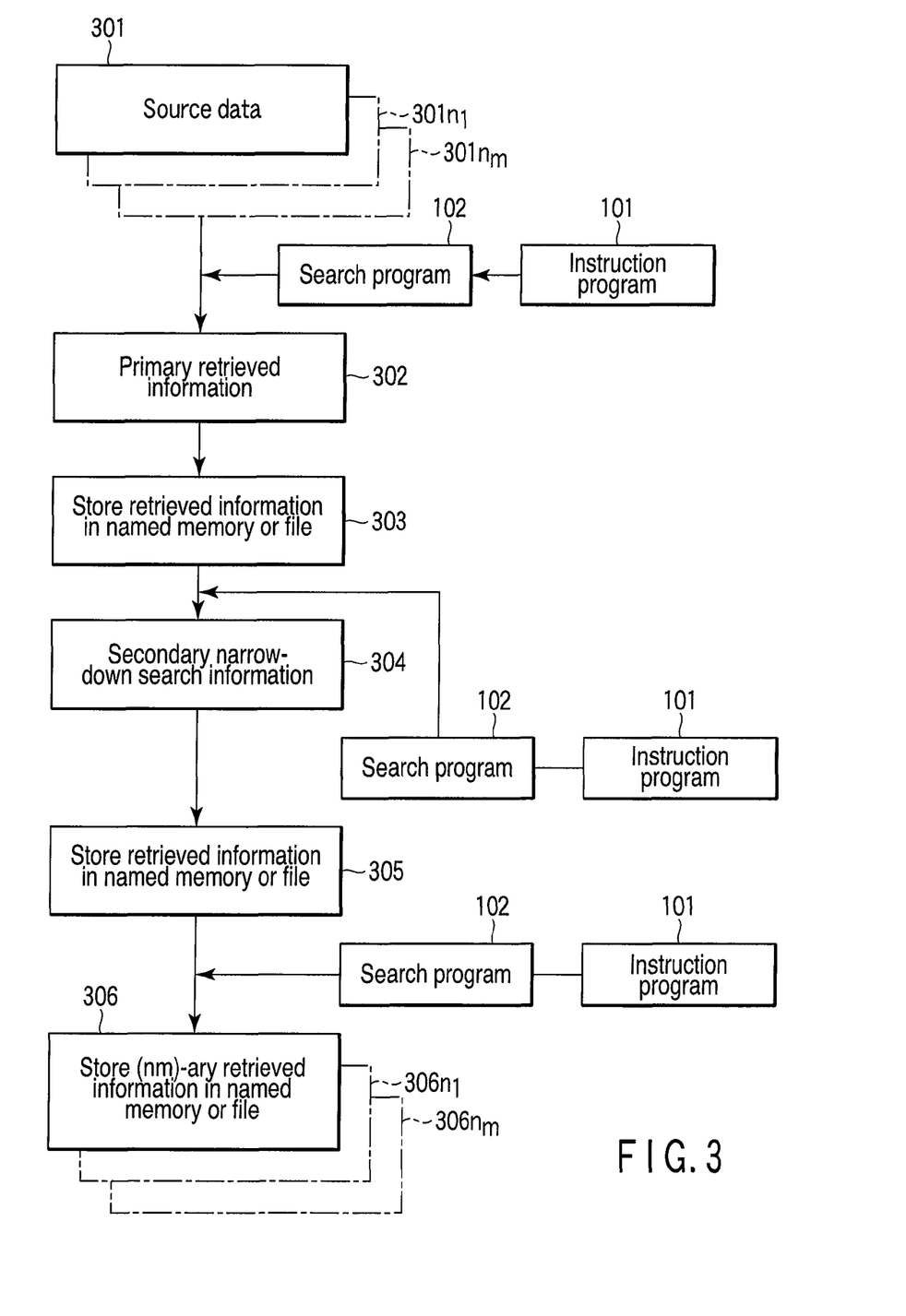
FIG. 3 is a flowchart showing the sequence of step-by-step search works.

FIG. 3 is a flowchart for explaining information search processing according to the embodiment of the present invention.

In a series of search works, source information 301 of a first search is normally loaded from a file. That is, a file is designated in "source information search destination information" of the execution parameters which are transmitted from the instruction program 101 to the search program 102, and a file name on the file is designated in a "source information name". Note that the user may designate these execution parameters via the instruction program 101 or the instruction program itself may automatically set them.

The search program 102 executes search processing based on the execution parameters transmitted from the instruction program 101. More specifically, the search program 102 decides based on the "source information search destination information" of the execution parameters in which of a file and memory source information to be searched is stored, and decides the source information to be searched based on the "source information name".

Since the file is designated in the "source information search destination information" and the file name on the file is designated in the "source information name", the search program 102 searches for information that matches search target conditions indicated by "search target condition information" using information designated by the file name on the file as the source information.

Information (primary retrieved information) 302 of a search result is stored in a named memory or file according to the execution parameter (303). More specifically, the search program 102 decides based on "storage destination information" of the execution parameters transmitted from the instruction program 101 which of a file or memory is used to store retrieved information, and stores the retrieved information as information to be written in the decided storage destination to have a "search result information name".

Assume that the "storage destination information" designates to store information in a memory. In this case, the search program 102 writes the retrieved information in the named memory, and stores the "search result information name" in a management table 201 together with memory area information in which the information is written. The "memory area" includes a start address, maximum size, and use size, as shown in FIG. 2. Also, additional information such as a date and time of writing the information may be stored.

In the next search, by designating the named memory by "source information search destination information" and the name by a "source information name", the information stored in the named memory as the previous search result can be used as source information (304).

Assume that a memory is designated in "source information search destination information" of execution parameters transmitted from the instruction program 101, and the same name as that of the memory in which the information searched first is stored (i.e., the "search result information name" of the execution parameters in the first search) is designated in a "source information name".

When the memory is designated in the "source information search destination information", the search program 102 searches the management table 201 for a name of a memory area that matches the "source information name". When the name of the memory area that matches the source information name is retrieved, the search program 102 acquires information that matches received search target condition information from a memory area associated with the retrieved name of the memory area.

Note that when a file is designated in "source information search destination information", the search program 102 acquires information that matches the search target condition information from a file having a file name that matches the "source information name".

The search program 102 decides based on "storage destination information" of the execution parameters transmitted from the instruction program 101 which of a file and memory is used to store retrieved information, and stores the retrieved information as information to be written in the decided storage destination to have a "search result information name" (305).

Assume that the "storage destination information" indicates to store information in the memory. In this case, the search program 102 writes the retrieved information in the named memory and stores the "search result information name" in the management table 201 together with memory area information in which information is written.

In the aforementioned example of the execution parameters, the case has been explained wherein pieces of information associated with the search target destination and information storage destination are included. Alternatively, only pieces of information ("storage destination information" and "search result information name") associated with the information storage destination may be used as execution parameters to only assure a named memory area in advance, and that name and memory area information may be assured on the management table 201.

The management table 201 may often store a name corresponding to the "search result information name". In such case, retrieved information is written in a memory area indicated by memory information associated with that "search result information name".

By repeating a search step by step, and designating a file by the execution parameter ("storage destination information"), final search result information can be stored in the file (306).

Note that the intermediate search result may be written out to a file as needed, and may be used as the next source information.

Each search may be conducted by deciding next search conditions after the user confirms the result. Or as a routine work, conditions of each search may be decided in advance, and instructions may be successively executed using a batch or script.

Figure 4:
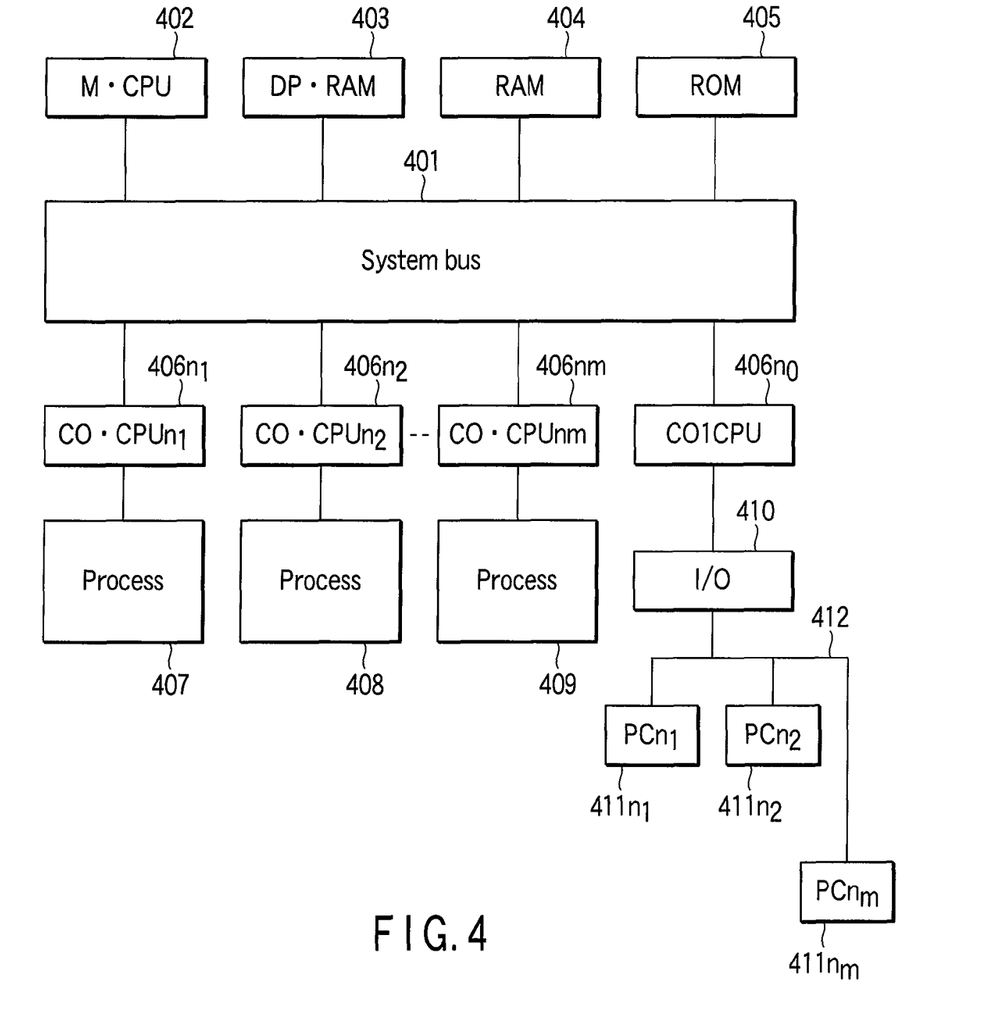
FIG. 4 is a block diagram showing an example when multi-CPUs and parallel machines are used.

FIG. 4 shows a case in which the present invention is used in a parallel machine environment across multi-CPUs and a plurality of PCs, so as to efficiently and quickly search information in large quantities for desired information.

In order to speed up search processing, a wide variety of processor systems are available. An array computer system is used to process information in the forms of sequences and matrices, and can concurrently process a plurality of pieces of information by a single instruction. The representative of this system is a supercomputer, which can handle parallel high-speed processing of matrix information of huge numerical values.

In addition, a parallel computer system includes a vector processor system and cluster computer system to cope with speeding-up, and it is effective to use the present invention in such environment.

FIG. 4 shows a main processor as a core, and a plurality of coprocessors which execute operation processes in response to instructions from the main processor. Reference numeral 401 denotes a system bus. To the system bus 401, a main CPU 402, dual port RAM 403, RAM 404, ROM 405, and coprocessors 406 are connected.

The main CPU 402 controls the coprocessors 406$n$1 to 406$nm$ and 406$n$0. The main CPU 402 exchanges information with the coprocessors 406$n$1 to 406$nm$ and 406$n$0, and controls the coprocessors 406$n$1 to 406$nm$ and 406$n$0. The dual port RAM 403 allows to simultaneously input and output information to and from a memory.

The RAM 404 is used as a memory of the main CPU 402. The ROM 405 is a program memory in which a program of the main processor 402 is written, and the main processor 402 executes processing using this program.

The coprocessors 406$n$1 to 406$nm$ and 406$n$0 execute processes under the management of the main processor 402. The coprocessors are assigned to respective input/output processes of respective named memories and files, control processes of I/O devices, and other processes, and execute parallel processes. At any rate, these coprocessors are means aiming at speeding-up.

The coprocessor 406$n$1 executes a process 407, for example, an information read process from a file or named memory.

The coprocessor 406$n$2 executes a process 408, for example, an information write process in a file or named memory.

The coprocessor 406$nm$ executes a process 409, for example, a search condition comparison process.

In this way, it is efficient to assign independent processes to respective processors. The number of coprocessors 406 and the number of processes 407 to 409 are increased/decreased as needed.

The main processor 402 performs generation and erasure of tasks, loading of a program, assignment of the coprocessors 406 to tasks, and task management of interrupt processes.

The coprocessor 406$n$0 controls an I/O 410. The I/O 410 is connected to PCs 411$n$1 to 411$nm$ via a LAN 412.

When source information is distributed to the plurality of PCs 411 and search programs parallelly run on the respective PCs, a high-speed search can be conducted. It is efficient to divide the source information so that each PC can load the assigned source information onto a memory at once. That is, the number of PCs can be increased in correspondence with the assumed source information size.

One or a plurality of PCs of the plurality of PCs 411 may use the instruction program, and the search program may run on other PCs.

The multi-CPUs and parallel machine system according to this embodiment can speed up the search processing by effectively assigning processes and source information to the respective CPUs and PCs.

Figure 5:
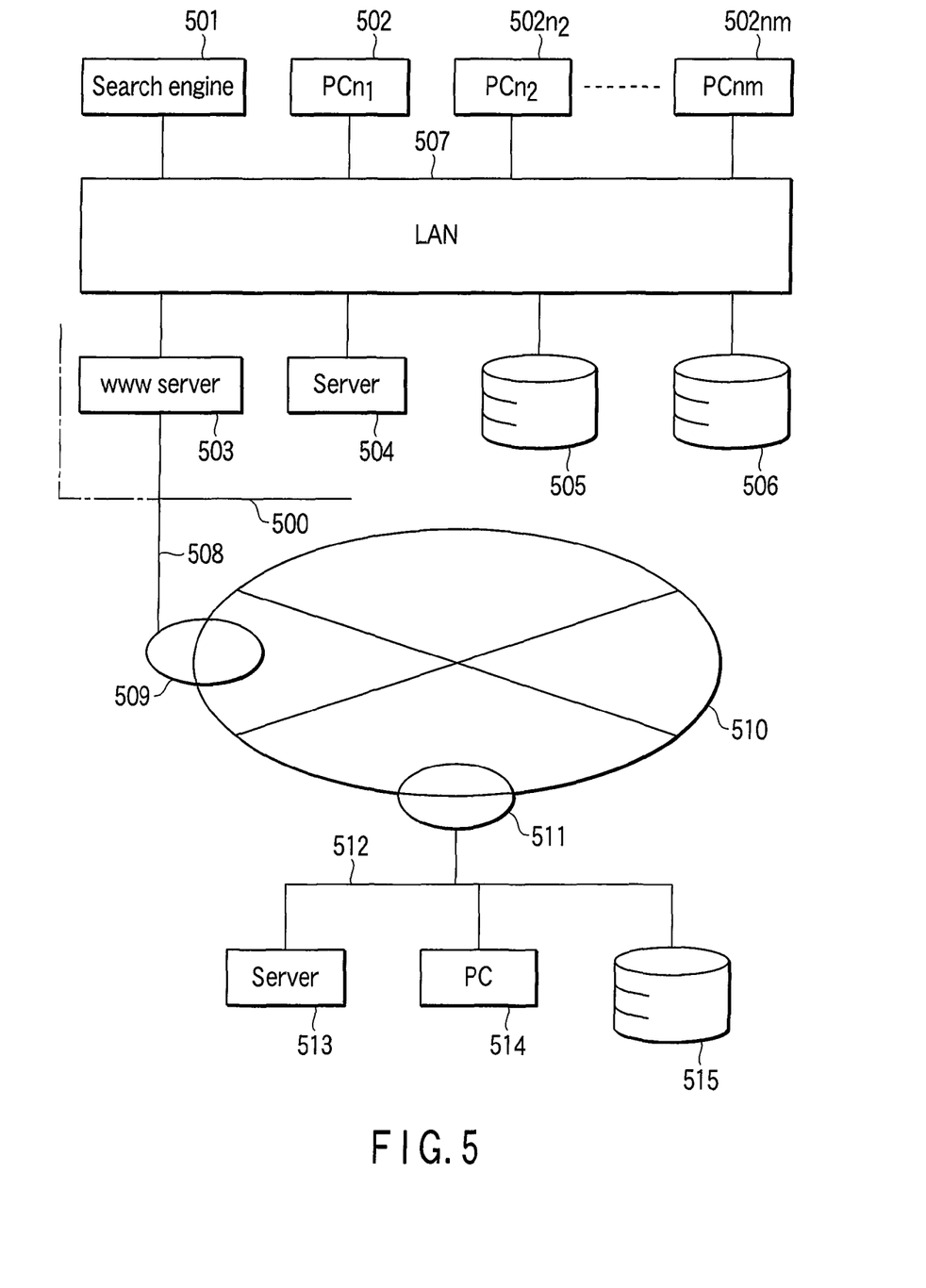
FIG. 5 is a block diagram showing a case in which a search is conducted via communication networks.

FIG. 5 is a block diagram showing a case in which the search system according to the embodiment of the present invention is further expanded via communication networks such as the Internet. Reference numeral 500 denotes an arrangement of a search site. Reference numeral 501 denotes a search engine, which corresponds to a search program, and includes the parallel machine environment with the arrangement shown in FIG. 4 described above.

Reference numeral 502 denotes PCs, and the user and client start searches from these PCs. As described above, the user and client can issue search instructions from other information devices and terminal devices such as PDAs (personal digital assistants), mobile phones, and digital information home appliances in place of the PCs.

Reference numeral 503 denotes a world wide web server which includes an Internet transaction processing function. The world wide web server 503 includes an access function with a public information communication network, and also a firewall function (a mechanism for protecting an internal network from hacking between the Internet and LAN) of preventing hacking by, e.g., a hacker.

Reference numeral 504 denotes a server, which has functions of a file server, a print server, a database server, a communication server for making communication control, and an application server for performing specific job processing.

Reference numerals 505 and 506 denote databases which save various kinds of information files. Files stored in these databases are accessed in response to a user's request to conduct a search. Information is updated and created as needed.

Reference numeral 507 denotes a LAN which organically connects these devices. Reference numeral 508 denotes a communication line connected to an information communication network 510. Reference numerals 509, 510, and 511 denote various dedicated web sites.

Reference numeral 511 denotes a database site. The database site 511 may be an image service site of videos, movies, and the like in addition to text data. In recent years, even nonprofessionals can produce advanced movies due to appearance of inexpensive, advanced hi-vision digital cameras, and individuals and companies who visit such archive libraries are increasing.

The site 511 is connected via the communication line 508. Reference numeral 512 denotes a LAN which organically connects devices of the archive library, and a server 513, PC 514, and database 515 are connected to the LAN 512. Note that the database 515 has a Terabyte-class large capacity since it stores text data, and video and audio information, and requires, in the PC 514, the aforementioned search engine 501 which is included in the search engine 501 and supports external searches.

By arranging the search engines with respect to information distributed around the globe, PCs and various information devices having the instruction program can conduct information searches.

FIG. 4 has explained that in the parallel environment of multi-CPUs, the processing can be speeded up by appropriately distributing resources to respective processes of the search program. More practically, a method of optimizing the numbers of threads to be assigned to respective processes upon implementing the processes of the search program by a plurality of threads will be described below.

The processes of the search program include, for example, a read process for reading one or a plurality of information sets from information held on a file or memory, a filtering process for filtering an information item set which matches designated conditions from the information read by the read means, and a write process for writing the information filtered by the filtering means on a file or memory.

These processes can be respectively implemented by independent threads.

In the search processing, since the read order of information in the information read process, the order of information subject to condition comparison in the filtering process, and the write order of information in the write process generally do not influence the result, the respective processes can be processed using a plurality of threads.

In a case in which an information format is predetermined, and the length per information unit set is fixed, since the information read or write position can be easily calculated, that case is suited to such parallel processes.

Assuming that processes are performed by a predetermined number of threads, it is most efficient for the entire program when all threads are equally in a high-load state.

For example, this is the case when the loads on the read process, filtering process, and write processes are equally high.

As a definition of the load on each process, for example, a total of CPU use times of all threads which executed that process within a predetermined period of time may be used.

This embodiment proposes a method of dynamically enhancing the processing efficiency of the whole search program by increasing the number of threads of a high-load process and decreasing the number of threads of a low-load process.

Figure 6:
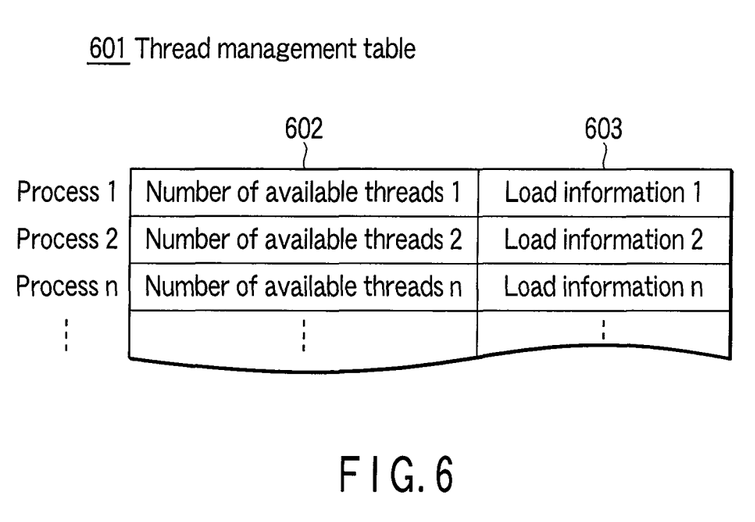
FIG. 6 is a view showing a thread management table.

FIG. 6 shows a thread management table used to manage the numbers of threads available for respective processes.

The search program 102 of this embodiment includes: a reception function of receiving search target condition information indicating conditions to be searched, source information storage destination information indicating in which of a file or memory source information to be searched is stored, a source information name of the source information to be searched, storage destination information indicating which of a file and memory is used to store retrieved information, and a search result information name of the retrieved information to be written; a search function of searching the management table for a name of a memory area that matches the received source information name of the source information to be searched when the received source information search destination information indicates that the source information to be searched is stored in the memory; an acquisition function of acquiring information that matches the received search target condition information from a memory area associated with the retrieved name of the memory area when the search function retrieves the name of the memory area that matches the received source information name of the source information to be searched; and a storage function of writing the information acquired by the acquisition function in the memory when the received storage destination information indicates that the memory is used to store information, and storing the received search result information name of the retrieved information to be written in the management table together with the memory area. The search program 102 can assign these functions to threads.

The search program 102 records the number of available threads 602 and current load information 603 for each process in a thread management table 601. As the load information, for example, a total of CPU use times of all threads which performed that process within a predetermined period of time may be used, as described above. The thread management table is accessible from respective processes.

Figure 7:
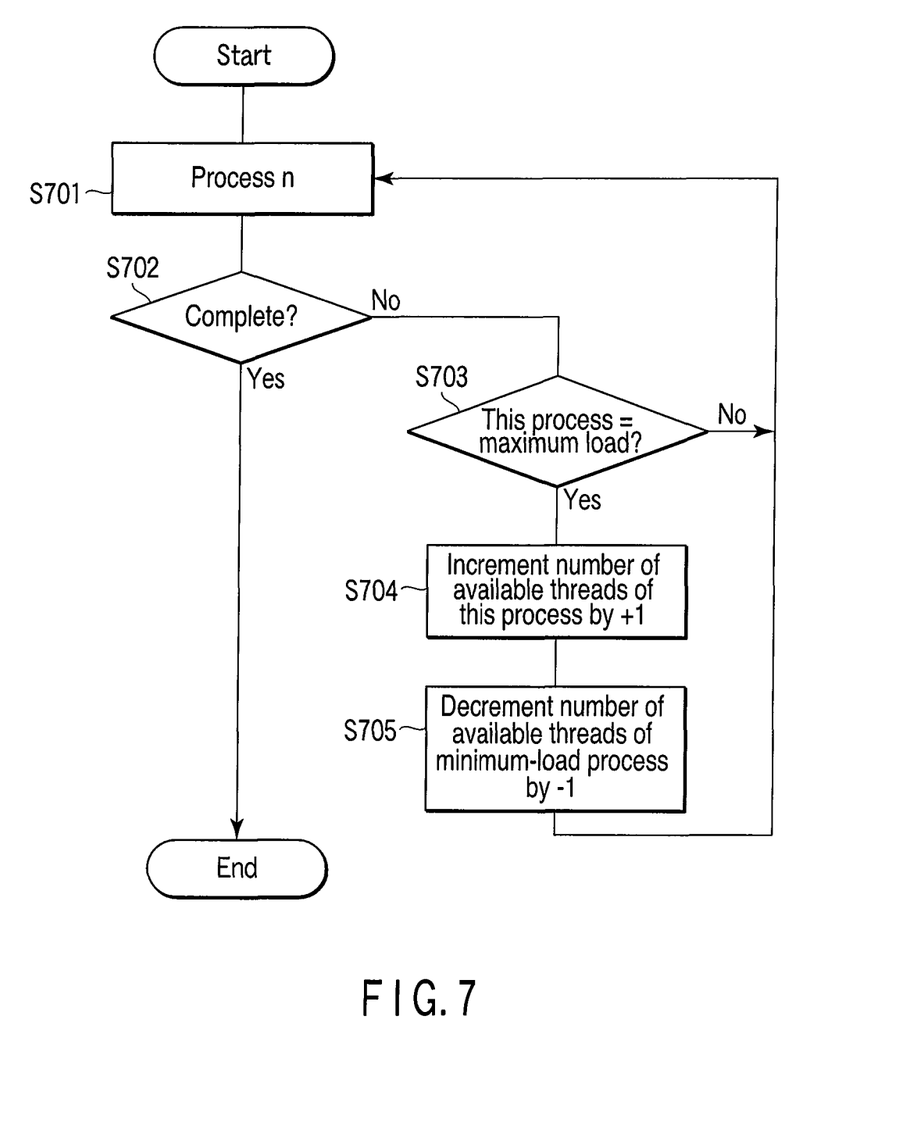
FIG. 7 is a flowchart showing the sequence for adjusting the numbers of threads used by respective processes.

FIG. 7 is a flowchart showing the sequence of a method of dynamically optimizing the numbers of available threads of respective processes.

Assume that a process in step S701 is repetitively executed for a given information block unit.

It is determined in step S702 if a process for a last information block is complete. If the process is complete, the processing ends; otherwise, an adjustment process of the number of threads is executed.

In step S703, pieces of load information of respective processes are compared with reference to the thread management table shown in FIG. 6. If the self process has a maximum load, the number of available threads of the self process recorded in the thread management table is increased in step S704. For example, the number of available threads is incremented by 1.

In step S705, the number of available threads recorded in the thread management table is decreased by the increment in step S704 for a minimum-load process. For example, the number of available threads is decremented by 1.

The process in step S701 is applied to the next information block using the updated number of threads.

A more practical description will be given taking the read process as an example.

In step S701, a predetermined unit number of pieces of information are read from a file. Assume that the number of available threads is set to be 2, and let A and B be these threads. Then, threads A and B alternately read information for one unit like ABAB . . . .

Assume that a total load of the two threads which perform this process, e.g., the CPU use time is maximum, and the load on, e.g., the write process is minimum. In the thread management table, the number of available threads of the read process is incremented to 3. Also, the number of available threads of the write process is decremented by 1.

Upon execution of the read process in step S701 next time, three threads A, B, and C alternately read information like ABCABC . . . .

By increasing the number of threads of a high-load process and decreasing the number of threads of a low-load process as needed in this way, the numbers of threads can be optimized to allow the whole search program to efficiently operate.

When the number of information sets which match the conditions is small, it is expected that the processing volume of the write process is smaller than those of the read process and filtering process. In such case, the optimal numbers of threads can be dynamically and autonomously distributed using the aforementioned mechanism without averagely distributing the numbers of threads to respective processes.

According to the present invention, since the information search result is saved on a memory to have a name designated by the user, the user's work efficiency can be enhanced and the work time can be shortened in an information search work which is performed step by step or repetitively in many cases.

Especially, the present invention is effective to search large-capacity information that reaches Terabytes.

A search for information distributed on a local hard disk or via a network can be conducted within a short period of time.

The present invention is expected to be applied to a search from a gene sequence information database, a full-text search from a literature database, and information search from operation logs of computers.

What is claimed is:

1. An information search system comprising:
    reception means for receiving parameters including search target condition information indicating a condition to be searched, search destination information indicating a file which is to be accessed by using a disk I/O or a memory, which is a search destination of a source information to be searched, and a source information name of the source information to be searched, wherein the source information to be searched is stored in either the file which is to be accessed by using the disk I/O or the memory;
    a management table which stores a name of a memory area and memory area information indicating the memory area in association with each other;
    search means for searching the management table for a name of a memory area which matches the received source information name of the source information to be searched when the received search destination information indicates the memory as the search destination; and
    acquisition means for acquiring information which matches the received search target condition information from a memory area indicated by memory area information associated with the retrieved name of the memory area when the search means retrieves the name of the memory area which matches the received source information name of the source information to be searched.

2. The information search system according to claim 1, wherein the reception means further receives storage destination information indicating which of a file and a memory is used to store retrieved information, and a search result information name of the retrieved information to be written, and the system further comprises storage means for, when the received storage destination information indicates that the memory is used to store information, writing the information acquired by the acquisition means in the memory, and storing the received search result information name of the retrieved information to be written in the management table together with memory area information indicating a memory area in which the information written in the memory is written.

3. The information search system according to claim 2, wherein the memory area information includes a start address, a maximum size, and a use size of the memory in which the acquired information is stored.

4. The information search system according to claim 1, wherein the search target condition information, the search destination information, and the source information name are output from an instruction program, and the search means and the acquisition means are included in a search program different from the instruction program.

5. The information search system according to claim 4, wherein the instruction program is stored in a first terminal, and the search program is stored in a second terminal.

6. The information search system according to claim 2, wherein the search means, the acquisition means, and the storage means are respectively assigned to a plurality of threads, and the system further comprises:
    measurement means for measuring a processing load of each thread on a CPU which performs processes of the plurality of threads; and
    change means for changing the numbers of threads assigned to the search means, the acquisition means, and the storage means based on the processing loads of the threads measured by the measurement means.

7. The information search system according to claim 1, wherein the reception means further receives storage destination information indicating which of a file and a memory is used to store retrieved information, and a search result information name of the retrieved information to be written, and the system further comprises storage means for, when the received storage destination information indicates that the memory is used to store information and memory area information corresponding to the received search result information name is stored on the management table, writing the information acquired by the acquisition means in a memory area indicated by the memory area information corresponding to the search result information name.

8. An information search method in an information search system, which comprises a management table which stores a name of a memory area and memory area information indicating the memory area in association with each other, comprising:
    receiving parameters including search target condition information indicating a condition to be searched, search destination information indicating a file which is to be accessed by using a disk I/O or a memory, which is a search destination of a source information to be searched, and a source information name of the source information to be searched, wherein the source information to be searched is stored in either the file which is to be accessed by using the disk I/O or the memory;
    searching the management table for a name of a memory area which matches the received source information name of the source information to be searched when the received search destination information indicates the memory as the search destination; and acquiring information which matches the received search target condition information from a memory area indicated by memory area information associated with the retrieved name of the memory area when the name of the memory area matches the received source information name of the source information to be searched.

9. A computer-readable medium in which a program used in an information search system is stored, wherein the information search system comprises a management table which stores a name of a memory area and memory area information indicating the memory area in association with each other, the program making the information search system execute:

receiving parameters including search target condition information indicating a condition to be searched, search destination information indicating a file which is to be accessed by using a disk I/O or a memory, which is a search destination of a source information to be searched, and a source information name of the source information to be searched, wherein the source information to be searched is stored in either the file which is to be accessed by using the disk I/O or the memory;

searching the management table for a name of a memory area which matches the received source information name of the source information to be searched when the received search destination information indicates the memory as the search destination; and acquiring information which matches the received search target condition information from a memory area indicated by memory area information associated with the retrieved name of the memory area when the name of the memory area matches the received source information name of the source information to be searched.

* * * * *